United States Patent
Yu et al.

[11] Patent Number: 6,010,948
[45] Date of Patent: Jan. 4, 2000

[54] SHALLOW TRENCH ISOLATION PROCESS EMPLOYING A BPSG TRENCH FILL

[75] Inventors: Chen-Hua Yu; Syun-Ming Jang, both of Hsin-Chu, Taiwan

[73] Assignee: Taiwan Semiconductor Manufacturing Company, Hsin-Chu, Taiwan

[21] Appl. No.: 09/244,879

[22] Filed: Feb. 5, 1999

[51] Int. Cl.[7] .................................................. H01L 21/762
[52] U.S. Cl. ........................... 438/436; 438/692; 438/784
[58] Field of Search ...................................... 438/436, 438, 438/FOR 227, 784, 692

[56] References Cited

U.S. PATENT DOCUMENTS

| | | |
|---|---|---|
| 5,112,772 | 5/1992 | Wilson et al. . |
| 5,208,179 | 5/1993 | Okazawa . |
| 5,229,316 | 7/1993 | Lee et al. . |
| 5,316,965 | 5/1994 | Philipossian et al. . |
| 5,447,884 | 9/1995 | Fahey et al. . |
| 5,492,858 | 2/1996 | Bose et al. . |
| 5,598,028 | 1/1997 | Losavio et al. . |
| 5,635,102 | 6/1997 | Mehta . |
| 5,716,495 | 2/1998 | Butterbaugh et al. . |
| 5,902,127 | 5/1999 | Park . |

*Primary Examiner*—George Fourson
*Attorney, Agent, or Firm*—George O. Saile; Stephen B. Ackerman

[57] ABSTRACT

A process for creating BPSG filled, shallow trench isolation regions, in a semiconductor substrate, has been developed. The process features the use of a BPSG layer with about 4 to 4.5 weight percent $B_2O_3$, and about 4 to 4.5 weight percent $P_2O_5$, in silicon oxide. This BPSG composition, when subjected to a high temperature anneal procedure, results in softening, or reflowing, of the BPSG layer, eliminating seams or voids, in the BPSG layer, that may have been present after BPSG deposition. The removal rate of BPSG, is lower than the removal rate of silicon oxide layer, in buffered HF solutions, thus allowing several buffered HF procedures to be performed without recessing of BPSG in the shallow trench. In addition this composition of BPSG performs as a gettering material for mobile ions, thus contributing to yield and reliability improvements, when used at the isolation region for MOSFET devices.

8 Claims, 3 Drawing Sheets

SHALLOW TRENCH ISOLATION PROCESS EMPLOYING A BPSG TRENCH FILL

BACKGROUND OF THE INVENTION (1) Field of the Invention

The present invention relates to methods used to fabricate semiconductor devices, and more specifically to a method used to create an insulator filled shallow trench, isolation region.

(2) Description of the Prior Art

The semiconductor industry is continually striving to increase the performance of semiconductor devices, while still attempting to maintain, or decrease, the processing cost of these same semiconductor devices. The ability to fabricate semiconductor devices with sub-micron features, or the use of micro-miniaturization, has allowed these performance and cost objectives to be partially realized. The use of sub-micron features, allow performance degrading, parasitic capacitances, to be reduced, resulting in higher performing semiconductor devices. In addition the use of sub-micron features, allow smaller semiconductor chips to be created, however still possessing device densities comparable to larger semiconductor chip counterparts, fabricated without the use of sub-micron features. The use of smaller semiconductor chips in turn result in the attainment of a greater number of chips to be achieved from a specific size starting substrate, thus reducing the processing cost of a specific semiconductor chip.

The attainment of micro-miniaturization has been achieved via advancements in specific semiconductor fabrication disciplines, such as photolithography, and dry etching. The use of advanced exposure cameras, as well as the development of more photosensitive photoresist materials, have allowed sub-micron features to be routinely achieved in masking photoresist layers. In addition the development of more advanced dry etching tools, and processes, have resulted in the successful transfer of the sub-micron images in the masking photoresist layers, to underlying semiconductor materials, such as silicon, silicon oxide, metal, and metal silicide. However in addition to the use of advanced semiconductor fabrication disciplines, specific components of the semiconductor device, have to be addressed to continue to successfully address the performance and cost objectives. For example, isolation regions, used to physically, and electrically, isolate devices, or device components, have been formed using field oxide regions, created via thermal oxidation procedures. Field oxide, (FOX), regions, are created via high temperature thermal oxidation, of specific regions of the semiconductor substrate. Areas of the semiconductor substrate, to be used for subsequent active device regions, are protected from the FOX oxidation process, via use of an oxidation resistant insulator mask, such as silicon nitride. However during the FOX oxidation procedure, a "birds beak" formation, or oxidation occurring under the edges of the masking insulator layer, is formed, reducing the amount of area allotted for the active device region. To accommodate "birds beak", a larger active device area has to designed, thus negatively influencing the objective of smaller chips, or reduced processing costs.

The deleterious effect of "birds beak", for FOX applications, has been addressed by the use of shallow trench isolation, (STI), as a replacement for the FOX isolation regions. STI features the creation of a shallow trench, in the semiconductor substrate, via conventional patterning procedures, followed by the filling of the shallow trench, with an insulator layer. Unwanted "birds beak" formation, is not encountered since STI is obtained without the use of oxidation procedures. However several concerns still exist, when using STI regions. For example the narrow width of the shallow trench, makes it difficult to fill with a chemically vapor deposited, (CVD), insulator layer, sometimes resulting in a seam, or void, in the insulator fill, in the center of the shallow trench. In addition CVD insulator layers, such as silicon oxide, have a high removal, or etch rate, in dilute, or buffered hydrofluoric acid solutions, and thus a silicon oxide fill, can be significantly recessed in the shallow trench, during subsequent procedures, such as pre-cleans used prior to metal deposition. This invention will teach a procedure for creating insulator filled, shallow trench isolation regions, in which a borophosphosilicate glass, (BPSG), layer, with specific concentrations of $B_2O_3$, and $P_2O_5$, in a silicon oxide layer, is used to fill the shallow trench. A subsequent high temperature anneal is then used to reflow the insulator fill, eliminating any seams or voids that may have existed after the CVD procedure. The use of this specific BPSG layer, exhibits a reduced removal rate in HF solutions, compared to silicon oxide counterparts, thus allowing dilute, or buffered HF, pre-clean procedures, to be performed, without significant recessing, in the shallow trench. In addition the ability of this specific BPSG layer, to getter, or tie up, mobile ions, such as sodium, potassium, or lithium, also allow more stable memory devices to be achieved. Prior art, such as Okazawa, in U.S. Pat. No. 5,208,179, describes the use of BPSG filled, deep trenches, in addition to the use of FOX isolation regions. That prior art also teaches a process sequence different than the present invention, in that the BPSG layer, in a deep trench region, is formed after the creation of FOX regions, and after the gate materials, such as polysilicon have been deposited, negating the gettering influence of BPSG on the covered gate insulator layer.

SUMMARY OF THE INVENTION

It is an object of this invention to form STI regions, in a semiconductor substrate, using BPSG as the insulator layer. in the shallow trench, It is another object of this invention to deposit the BPSG layer, comprised of a specific concentration of $B_2O_3$ and $P_2O_5$, in the silicon oxide layer, to enhance the reflow characteristics, and the mobile ion gettering characteristics, of the BPSG layer, in the shallow trench.

It is still another object of this invention to reflow the BPSG layer, via high temperature annealing procedures, to eliminate seams or voids in BPSG, in the shallow trenches.

In accordance with the present invention, a process for forming BPSG filled, shallow trenches, in a semiconductor substrate, to be used as isolation regions for semiconductor devices, and with the BPSG layer featuring specific concentrations of $B_2O_3$ and $P_2O_5$, to enhance the BPSG reflow and mobile ion gettering characteristics, has been developed. A shallow trench is formed in the semiconductor substrate, via conventional photolithographic and anisotropic, reactive ion etching, (RIE), procedures. A thin silicon oxide layer is thermally grown, lining the exposed surfaces of the shallow trench. A layer of BPSG is next deposited, using tetraethylorthosilicate, (TEOS), as a source for silicon oxide, with the addition of specific amounts of diborane, and phosphine, used to form a BPSG layer, incorporating specific amounts of $B_2O_3$ and $P_2O_5$. A high temperature anneal procedure is next performed, allowing the BPSG layer to soften and reflow, eliminating any seam or void that may have existed in the BPSG layer, filling the shallow trench. A chemical mechanical polishing, (CMP), procedure is then used to remove BPSG from the top surface of the semiconductor substrate, creating the BPSG filled, STI regions. The fabrication of semiconductor devices is then performed, featuring the creation of a polysilicon gate structure, on an underlying gate insulator layer, including the formation of lightly doped source/drain regions, insulator spacers on the sides of the polysilicon gate structures, and heavily doped source/drain regions. The creation of metal silicide layers on the top surface of the polysilicon gate structure, and on the surface of the heavily doped source/drain region, is performed using buffered hydrofluoric, (BHF), acid pre-clean procedures, with the exposed BPSG filled, shallow trench region, only marginally thinned during the pre-clean procedure, as a result of the reduced removal rate of the BPSG layer, featuring the specific concentrations of $B_2O_3$ and $P_2O_5$.

BRIEF DESCRIPTION OF THE DRAWINGS

The object and other advantages of this invention are best described in the preferred embodiment with reference to the attached drawing that include.

DESCRIPTION OF THE PREFERRED EMBODIMENTS

The method of fabricating a semiconductor device, using BPSG filled, shallow trench isolation regions, featuring a BPSG layer, comprised of specific levels of $B_2O_3$ and $P_2O_5$, used to enhance the reflow and mobile ion gettering characteristics of the BPSG layer, will now be described in detail. The semiconductor device, fabricated using BPSG filled, shallow trenches, will be a metal oxide semiconductor field effect transistor, (MOSFET), device, and for this case will be an N channel, (NFET), device. However this invention can be applied to P channel, (PFET), devices, as well as complimentary, (CMOS), devices, or bipolar devices.

Figure 1:
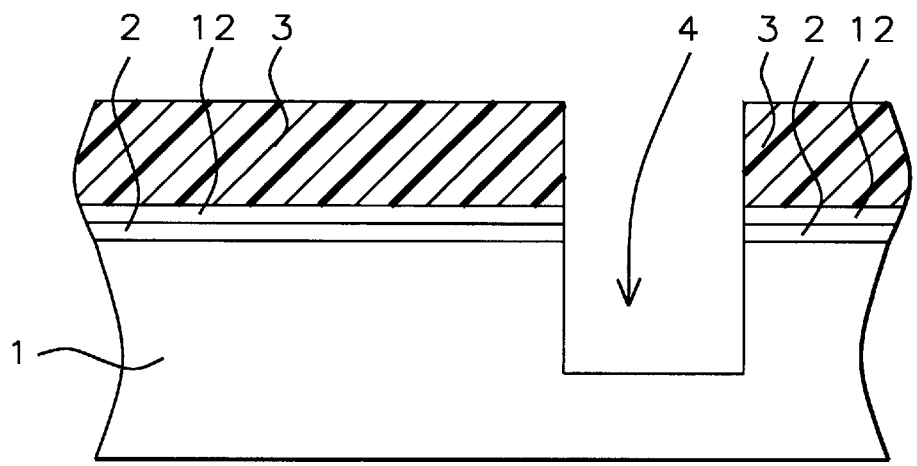
FIGS. 1–8, which schematically, in cross-sectional style, illustrate the fabrication of a semiconductor device, using BPSG filled, shallow trench isolation regions.

A P type, semiconductor substrate 1, comprised of single crystalline silicon, with a <100> crystallographic orientation is used and schematically shown in FIG. 1. A capping silicon oxide layer 2, to be used to protect the semiconductor substrate from subsequent BPSG procedures, is thermally grown in an oxygen—steam ambient, to a thickness between about 50 to 300 Angstroms. Silicon oxide layer 2, can also be deposited using low pressure chemical vapor deposition, (LPCVD), or plasma enhanced chemical vapor deposition, (PECVD), procedures, again at a thickness between about 50 to 300 Angstroms. Silicon nitride layer 12, is next deposited, again via LPCVD or PECVD procedures, at a thickness between about 100–2000 Angstroms, Silicon nitride layer 12, will subsequently serve as a stop layer, for a subsequent chemical mechanical polishing procedure, used to define the insulator fill, in a shallow trench shape. A photoresist shape 3, is formed, allowing the creation of shallow trench 4, to be performed via an anisotropic RIE procedure, using $CHF_3$ as an etchant for silicon nitride layer 12, and for capping silicon oxide layer 2, while $Cl_2$ is used as an etchant for semiconductor substrate 1, creating the shallow trench shape. Shallow trench 4, schematically shown in FIG. 1. is formed to a depth, in semiconductor substrate 1, between about 2000 to 6000 Angstroms.

Figure 2:
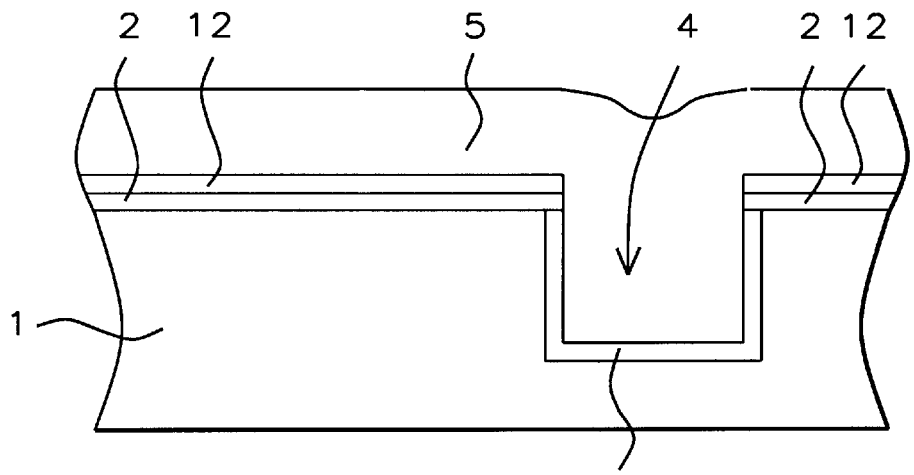

After removal of photoresist shape 3, via plasma oxygen ashing and careful wet cleans, a silicon oxide liner 20, shown schematically in FIG. 2, is thermally grown on the exposed surfaces of shallow trench 4, in an oxygen—steam ambient, to a thickness between about 50 to 500 Angstroms. Silicon oxide liner 20, is used to separate the subsequent BPSG layer, from silicon surfaces, exposed in shallow trench 4, however silicon oxide liner 20, is optional, and can be omitted if desired. The critical BPSG layer 5, is next deposited using LPCVD or PECVD procedures, to a thickness between about 1000 to 10000 Angstroms, completely filling shallow trench 4. The BPSG layer is deposited using TEOS as a source for the silicon oxide component, while diborane is used as a source for the $B_2O_3$ component, at a weight % between about 4.0 to 4.5, while the addition of phosphine during the deposition, is used for the $P_2O_5$ component of BPSG layer 5, at a weight % between about 4.0 to 4.5. These concentrations allow the BPSG layer: to soften and reflow at elevated temperatures; to getter mobile ions that can deleteriously influence MOSFET yield and performance; and to sustain subsequent BHF pre-clean exposures, without significant thinning. The filling of shallow trench 4, via LPCVD or PECVD procedures, initiates via BPSG coatings on the sides of the shallow trench. When filling narrow width, shallow trenches, a seam or void can be created at the point in which the BPSG layers, on the sides of the shallow trench, converge. If the seam or void were to remain, subsequent processing, such as RIE, can enlarge the seam or void, possibly resulting in MOSFET yield loss, or reliability failures, due to defects or contamination being trapped in the seam or void. Therefore a high temperature anneal procedure, is performed at a temperature between about 800 to 1200° C., for a time between about 0.1 to 100 min., in a nitrogen ambient, allowing the softening of BPSG layer 5, resulting in BPSG reflow, eliminating the seam or void in the BPSG fill. The reflow of the BPSG layer, is optimized using the specific concentrations of $B_2O_3$ and $P_2O_5$, previously described. The result of the reflow procedure is schematically shown in FIG. 2.

Figure 3:
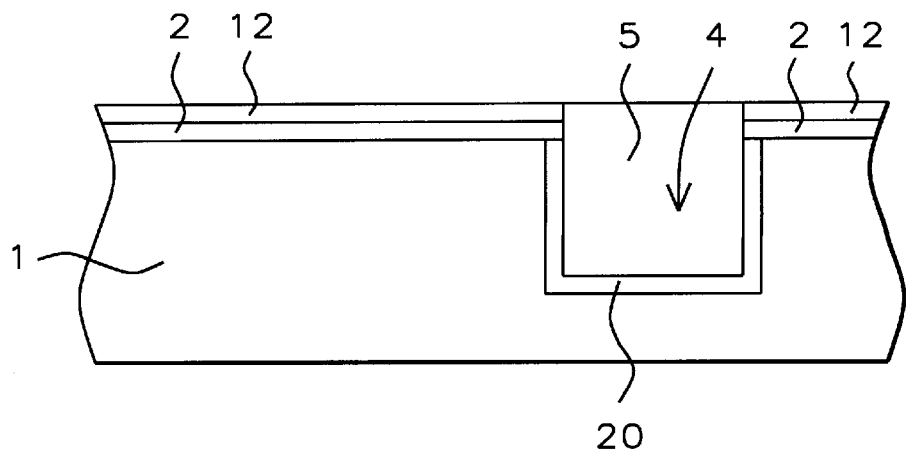
Figure 4:
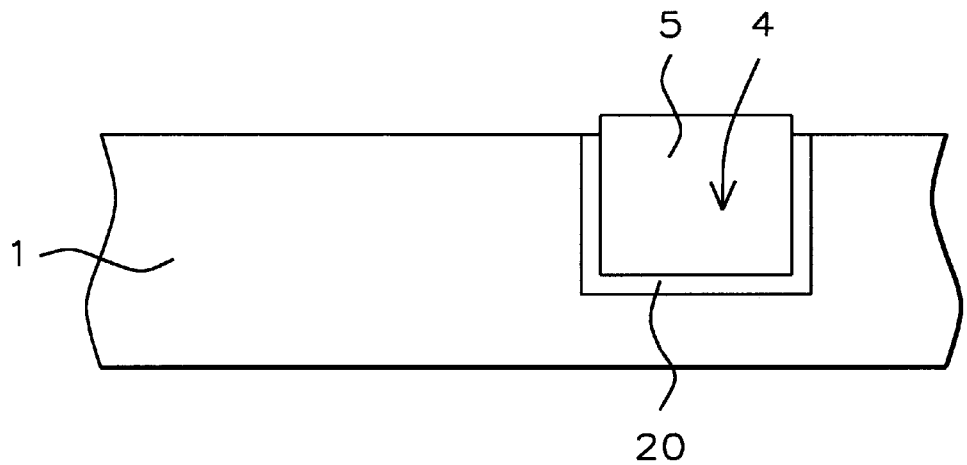

Removal of BPSG layer 5, from the top surface of silicon nitride layer 12, is accomplished via a CMP procedure. The removal, or polishing rate of BPSG layer 5, is greater than the removal rate of silicon nitride layer 12, thus allowing the CMP procedure to slow or stop, on silicon oxide layer 2. This is schematically shown in FIG. 3. Silicon nitride layer 12, is next removed using a selective hot phosphoric acid solution, followed by the removal of silicon oxide layer 2, via use of 50:1 BHF solution. The lower etch rate of BPSG, in both hot phosphoric acid, and in BHF solutions, compared to silicon nitride, and silicon oxide, allows the removal of silicon nitride layer 12, and silicon oxide layer 2, without the recessing of BPSG layer 5, in shallow trench 4. For example the removal rate of BPSG, in the BHF solution is only about 20 Angstroms/min, compared to a removal rate of silicon oxide, in the same BHF solution, of about 200 Angstroms/min. This is schematically shown in FIG. 4.

Figure 5:
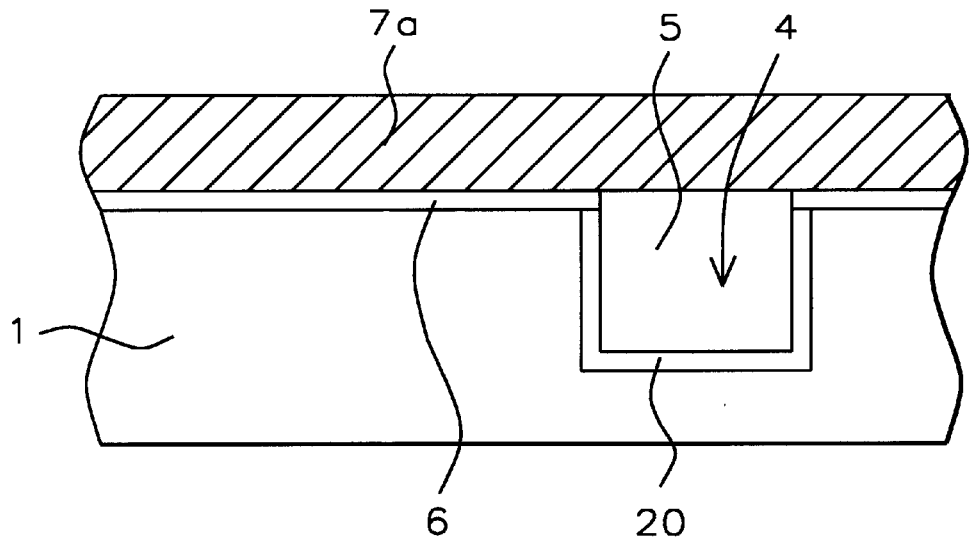
Figure 6:
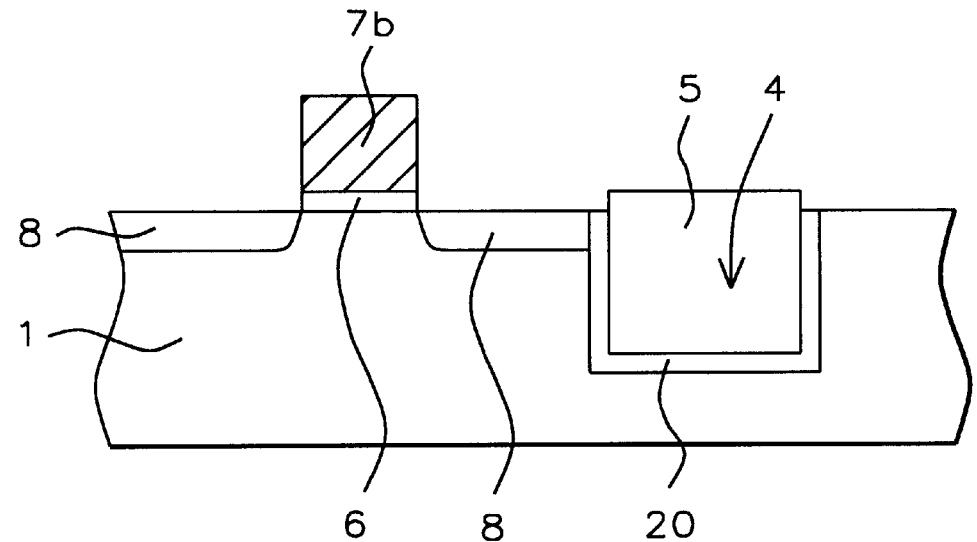

The creation of the MOSFET device, used with BPSG filled, shallow trench isolation regions, is next described using FIGS. 5–8. A thin silicon dioxide, gate insulator layer 6, is thermally grown on the surface of semiconductor substrate 1, to a thickness between about 15 to 200 Angstroms, via thermal oxidation procedures, in an oxygen—steam ambient. A polysilicon layer 7a, schematically shown in FIG. 5, is deposited, via LPCVD procedures, to a thickness between about 500 to 3500 Angstroms. Polysilicon layer 7a, can be doped in situ, during deposition, via the addition of phosphine or arsine, to a silane ambient, or polysilicon layer 7a, can be deposited intrinsically, then doped via ion implantation procedures, using arsenic or phosphorous ions. Conventional photolithographic and anisotropic RIE procedures, using $Cl_2$ as an etchant for polysilicon layer 7a, are used to create polysilicon gate structure 7b, schematically shown in FIG. 6. Removal of the photoresist shape, used for the definition of polysilicon gate structure 7b, is accomplished via plasma oxygen ashing and careful wet cleans. The wet clean procedure includes a BHF step, removing regions of silicon dioxide, gate insulator layer 6, not covered by polysilicon gate structure 7b. Again BPSG layer 5, exposed in shallow trench 4, was not significantly recessed, due to the low removal rate of BPSG in BHF solutions. Lightly doped source/drain regions 8, schematically shown in FIG. 6, are formed in regions of semiconductor substrate 1, via an ion implantation procedure, using arsenic or phosphorous ions, at an energy between about 5 to 100 KeV, at a dose between about 1E12 to 5E14 atoms/cm$^2$.

Figure 7:
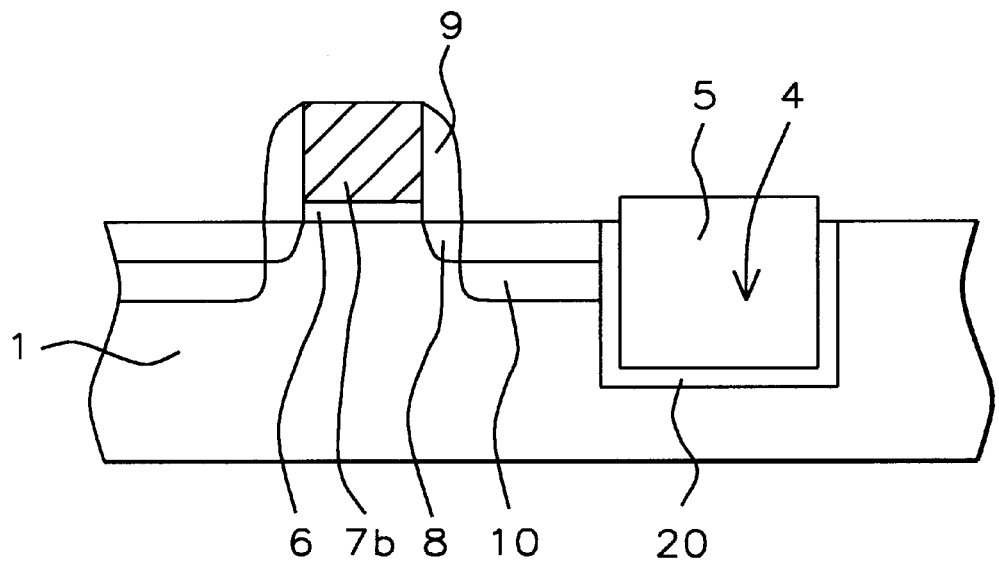

An insulator layer, comprised of silicon oxide, or silicon nitride, is next deposited using LPCVD or PECVD procedures, to a thickness between about 100 to 3000 Angstroms. An anisotropic RIE procedure, using $CHF_3$ as an etchant for silicon oxide, or using $CF_4$ as an etchant, if the insulator layer is comprised of silicon nitride, is used to form insulator spacers 9, on the sides of polysilicon gate structure 7b. Heavily doped source/drain region 10, is then formed, in regions of semiconductor substrate 1, not covered by insulator spacers 9, or by polysilicon gate structure 7b. Heavily doped source/drain region 10, shown schematically in FIG. 7, is formed via ion implantation of arsenic or phosphorous ions, at an energy between about 5 to 100 KeV, at a dose between about 1E15 to 2E16 atoms/cm$^2$.

Figure 8:
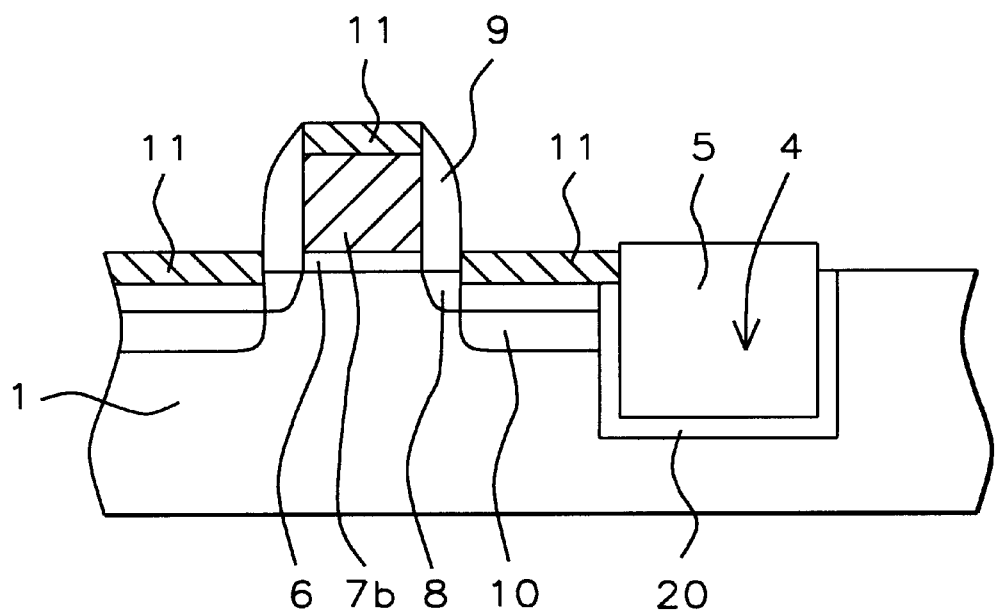

A metal silicide layer 11, such as titanium silicide, schematically shown in FIG. 8, is formed on the top surface of polysilicon gate structure 7b, and on the surface of heavily doped source/drain regions 11. Prior to the deposition of the metal, or titanium layer, used for the formation of the metal silicide, another 8:1 BHF procedure is used to remove any native oxide that may have formed on the exposed silicon or polysilicon surfaces. Again the BHF procedure does not result in a significant removal of BPSG layer 5, exposed in shallow trench 4, due to the low etch rate of BPSG, in BHF, when compared to the removal rates of native oxides in the same BHF solution. The titanium layer is then deposited, via R.F. sputtering procedures, to a thickness between about 100 to 500 Angstroms. An overlying titanium nitride layer, is optional. A first rapid thermal anneal, (RTA), procedure, is performed at a temperature between about 500 to 800° C., for a time between about 30 to 120 sec, to convert the titanium layer, to a first titanium silicide layer, in regions in which titanium overlaid the top surface of polysilicon gate structure 7, and heavily doped source/drain region 10. Regions in which the titanium layer resided on BPSG layer 5, or insulator spacers 9, remain unreacted and are selectively removed using a 1:1:5 solution of $H_2O_2$: $NH_4OH:H_2O$, at a temperature between about 60 to 90° C. A second RTA procedure is then performed, at a temperature between about 800 to 1000° C., for a time between about 20 to 120 sec, to create second titanium silicide layer 11, exhibiting a lower resistance then the first titanium silicide layer.

While this invention has been particularly shown and described with reference to the preferred embodiments thereof, it will be understood by those skilled in the art that various changes in form and details made be made without departing from the spirit and scope of this invention.

What is claimed is:

1. A method of forming a insulator filled, shallow trench isolation region, for a MOSFET device, on a semiconductor substrate, using a deposited, and reflowed, BPSG layer, to fill shallow trench regions, in said semiconductor substrate, comprising the steps of:

forming a capping silicon oxide layer on said semiconductor substrate;

forming a silicon nitride stop layer, on said capping silicon oxide layer;

forming a shallow trench in said silicon nitride stop layer, in said capping silicon oxide layer, and in said semiconductor substrate;

growing a silicon oxide liner on the exposed silicon surfaces of said shallow trench;

depositing a BPSG layer, containing between about 4.0 to 4.5 weight percent $B_2O_3$, and containing between about 4.0 to 4.5 weight percent $P_2O_5$, completely filling said shallow trench;

reflowing of said BPSG layer, via a temperature anneal procedure, at a temperature between about 800 to 1200° C.;

performing a chemical mechanical polishing procedure to remove said BPSG layer, from the top surface of said silicon nitride stop layer, creating a BPSG filled, shallow trench region;

removing said silicon nitride stop layer; and removing said capping silicon oxide layer.

2. The method of claim 1, wherein said shallow trench is formed in said semiconductor substrate via an anisotropic RIE procedure, using $Cl_2$ as an etchant for silicon.

3. The method of claim 1, wherein said shallow trench is formed in said semiconductor substrate to a depth between about 2000 to 6000 Angstroms.

4. The method of claim 1, wherein said silicon oxide liner, is formed via thermal oxidation procedures, in an oxygen—steam ambient, to a thickness between about 50 to 500 Angstroms.

5. The method of claim 1, wherein said BPSG layer, containing between about 4.0 to 4.5 weight percent $B_2O_3$, and between about 4.0 to 4.5 weight percent $P_2O_5$, is obtained via LPCVD or PECVD procedures, to a thickness between about 1000 to 10000 Angstroms.

6. The method of claim 1, wherein said temperature anneal procedure, used for reflowing of said BPSG layer, at a temperature between about 800 to 1200° C., is performed for a time between about 0.1 to 120 min., in a nitrogen ambient.

7. The method of claim 1, wherein said silicon nitride stop layer is removed using a phosphoric acid solution.

8. The method of claim 1, wherein said capping silicon oxide layer is removed using a 50:1 BHF solution, allowing said capping silicon oxide layer to be removed at a rate of about 200 Angstroms/min: while said BPSG layer is removed at a rate of only about 20 Angstroms/min.

* * * * *